United States Patent
Takahashi

(10) Patent No.: US 6,831,955 B1
(45) Date of Patent: Dec. 14, 2004

(54) NOISE GENERATOR

(75) Inventor: Masayuki Takahashi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/520,451

(22) Filed: Mar. 8, 2000

(30) Foreign Application Priority Data

Mar. 18, 1999 (JP) .......................... 11-074533

(51) Int. Cl.$^7$ .............................. H04L 27/36; H04L 9/04
(52) U.S. Cl. ........................................... 375/298; 380/44
(58) Field of Search .................... 375/298, 224, 375/248, 345; 455/226

(56) References Cited

U.S. PATENT DOCUMENTS

| | | | | |
|---|---|---|---|---|
| 3,816,765 A | * | 6/1974 | Goyer ........................... | 326/80 |
| 4,246,608 A | * | 1/1981 | Baker ........................... | 348/192 |
| 4,852,123 A | * | 7/1989 | Bickley et al. ............... | 375/223 |
| 5,157,652 A | * | 10/1992 | Walker ........................ | 370/252 |
| 5,239,494 A | * | 8/1993 | Golbeck ....................... | 708/3 |
| 5,465,050 A | * | 11/1995 | Marinelli et al. ............ | 324/603 |
| 5,519,888 A | * | 5/1996 | Hall et al. ................... | 455/249.1 |
| 5,539,772 A | * | 7/1996 | Fasulo et al. ................ | 375/224 |
| 5,848,160 A | * | 12/1998 | Cai et al. ...................... | 380/44 |
| 5,982,234 A | * | 11/1999 | Compagne ................... | 330/149 |

FOREIGN PATENT DOCUMENTS

| | | |
|---|---|---|
| JP | 05-226936 | 9/1993 |
| JP | 05-276202 | 10/1993 |
| JP | 09-046136 | 2/1997 |
| JP | 09-246869 | 9/1997 |
| JP | 11-234096 | 8/1999 |

* cited by examiner

*Primary Examiner*—Stephen Chin
*Assistant Examiner*—Larence Williams
(74) *Attorney, Agent, or Firm*—Fish & Richardson P.C.

(57) ABSTRACT

To generate a noise signal corresponding to an "antinoise environmental test" of CDMA, a noise generator 1 has a noise source A 2, an amplifier A 4, and a filter A 6 for generating an I signal for quadrature modulation and a noise source B 3, an amplifier B 5, and a filter B 7 for generating a Q signal for quadrature modulation and performs quadrature modulation for the I and Q signals generated by the circuits by a quadrature modulator 8 in accordance with a local signal supplied from a local signal source 9, then outputs a noise signal.

10 Claims, 5 Drawing Sheets

ND GENERATOR

BACKGROUND OF THE INVENTION

This invention relates to a noise generator used for a noise environmental test of a mobile communication machine and in particular to a noise generator preferred for a noise environment test of a mobile communication machine compatible with CDMA (Code Division Multiple Access).

In recent years, the number of users carrying mobile communication machines such as portable telephones and pager units has increased rapidly with the development of mobile communication technologies. In former mobile communication, a radio frequency band is stipulated in response to the mobile communication system (analog or digital) and the number of channels that can communicate at the same time is set depending on the stipulated radio frequency band.

The digital system which allows a larger number of channels to be set efficiently even on the same radio frequency band have become mainstream as recent mobile communication systems, and portable telephones and portable information machines equipped with a mobile communication function, compatible with the digital mobile communication system are widely used.

However, since TDMA (Time Division Multiple Access) is used as the former digital mobile communication system, a situation in which channels cannot be sufficiently assigned and communication becomes impossible occurs frequently in a district where the users concentrate, such as cities, because of a rapid increase in the number of users. Then, attention is focused on CDMA as a digital mobile communication system enabling a large number of channels to be assigned more efficiently than the TDMA.

In the CDMA, the transmitting party multiplies data signals of voice, etc., of a number of senders by different codes and uses one frequency band to transmit the resultant signals, and the receiving party can multiply the resultant signal by the code of the associated party that the receiving party communicates with, thereby decoding and taking out only the communication signal of the associated party.

The CDMA communication standard specifies that a particular test item of "antinoise environmental test" be carried out for mobile communication machines (containing communication base stations and portable communication terminals) compatible with the CDMA, and a noise generator used for the "antinoise environmental test" is required.

Since the frequency band used in the CDMA is wider than the frequency band used for each channel in the TDMA, a noise generator used for the "antinoise environmental test" requires a capability of generating a noise signal covering the CDMA frequency band.

To generate a wide-band noise signal covering the CDMA frequency band, a noise generator of this kind in a related art converts digital data into analog form to generate a noise signal or converts an appropriate analog noise signal into digital form, then modulates the digital signal to generate a desired noise signal, for example.

However, to generate a wide-band noise signal covering the CDMA frequency band, the noise generator in the related art used for the "antinoise environmental test" mentioned above converts digital data into analog form to generate a noise signal or converts an appropriate analog noise signal into digital form, then modulates the digital signal to generate a desired noise signal, for example. Thus, the noise source configuration becomes complicated and software for controlling the A/D converter also becomes necessary, increasing costs of the noise generator.

SUMMARY OF THE INVENTION

It is therefore an object of the invention to construct a noise generator of only hardware for generating a wide-band noise signal corresponding to an "antinoise environmental test" of CDMA for reducing the costs of the noise generator.

According to the invention as in aspect 1, there is provided a noise generator comprising:

a first noise source for generating a predetermined noise signal;

a second noise source for generating a predetermined noise signal;

a first amplification circuit for amplifying the noise signal generated from the first noise source at a predetermined amplification factor;

a second amplification circuit for amplifying the noise signal generated from the second noise source at a predetermined amplification factor;

a first filter circuit for extracting a first noise signal contained in a predetermined frequency band from the noise signal amplified by the first amplification circuit;

a second filter circuit for extracting a second noise signal contained in a predetermined frequency band from the noise signal amplified by the second amplification circuit; and a modulation circuit for modulating the first noise signal extracted through the first filter circuit and the second noise signal extracted through the second filter circuit and outputting a noise signal of a desired frequency band.

According to the noise generator of the invention as in aspect 1, the first amplification circuit amplifies the noise signal generated from the first noise source at a predetermined amplification factor, the second amplification circuit amplifies the noise signal generated from the second noise source at a predetermined amplification factor, the first filter circuit extracts a first noise signal contained in a predetermined frequency band from the noise signal amplified by the first amplification circuit, the second filter circuit extracts a second noise signal contained in a predetermined frequency band from the noise signal amplified by the second amplification circuit, and the modulation circuit modulates the first noise signal extracted through the first filter circuit and the second noise signal extracted through the second filter circuit and outputs a noise signal of a desired frequency band.

Therefore, the noise generator can be constructed of only hardware and the costs of the noise generator can be decreased.

In this case, as in the invention as in aspect 2, preferably, in the noise generator as in aspect 1, the modulation circuit is a quadrature modulation circuit for quadrature-modulating the first and second noise signals based on a local signal of a desired angular frequency supplied from an external local signal source and outputting a noise signal of a desired frequency band.

According to the noise generator of the invention as in aspect 2, the modulation circuit is a quadrature modulation circuit for quadrature-modulating the first and second noise signals based on a local signal of a desired angular frequency supplied from an external local signal source and outputting a noise signal of a desired frequency band, whereby a noise generator for generating a wide-band noise signal on a desired frequency band determined by the frequency of the local signal and the configuration of the first and second filter circuits can be constructed easily; for example, a noise generator for generating a noise signal that can be used with an "antinoise environmental test" of CMDA can be provided.

As in the invention as in aspect 3, preferably, in the noise generator as in aspect 1 or 2, amplification factor setting of both or either of the first and second amplification circuits can be made variable and a capacitor for cutting a DC component of the amplified noise signal is connected to the output stage in series. The capacitor for cutting the DC component can eliminate the need for considering the DC components in the circuits at the stages following the amplification circuit, caused by DC offset voltage generated in the amplification circuit particularly when the amplification factor is large.

According to the noise generator of the invention as in aspect 3, amplification factor setting of both or either of the first and second amplification circuits can be made variable, thus a capacitor for cutting a DC component of the amplified noise signal is connected to the output stage in series, whereby flattening the noise signal level in the proximity of the center angular frequency ω and the phase component for the frequency characteristic in the proximity of the center angular frequency of the noise signal output from the quadrature modulation circuit can be easily adjusted by varying setting of the amplification factor of the first or second amplifier.

As in the invention as in aspect 4, preferably, in the noise generator as in any of aspects 1 to 3, each of the first and second filter circuits is made of a low-pass filter circuit.

According to the noise generator of the invention as in aspect 4, each of the first and second filter circuits is made of a low-pass filter circuit, whereby a noise signal of a desired frequency band can be extracted easily.

As in the invention as in aspect 5, preferably, in the noise generator as in any of aspects 1 to 4, each of the first and second noise sources is made of a Zener diode circuit.

According to the noise generator of the invention as in aspect 5, each of the first and second noise sources is made of a Zener diode circuit, whereby the costs of the noise generator can be decreased.

BRIEF DESCRIPTION OF THE DRAWINGS

FIG. 2A is a drawing to show the noise band of the I and Q signals and FIG. 2B is a drawing to show the noise band of an output signal resulting from quadrature-modulating the I and Q signals in FIG. 2A;

FIG. 3A is a drawing to show the noise band of the amplified signal with no C coupling and FIG. 3B is a drawing to show the noise band of the amplified signal with C coupling;

DETAILED DESCRIPTION OF THE PREFERRED EMBODIMENTS

Referring now to the accompanying drawings, there is shown an embodiment of the invention.

FIGS. 1 to 5 are drawings to show one embodiment of a noise generator compatible with "antinoise environmental test" of CDMA incorporating the invention.

First, the configuration of the noise generator will be discussed.

Figure 1:
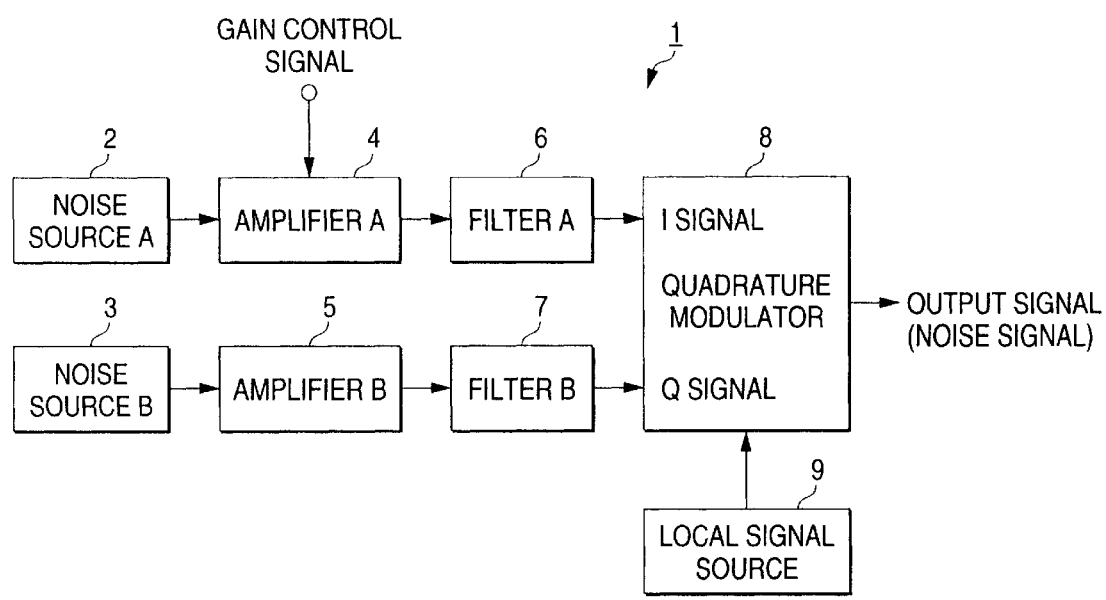
FIG. 1 is a block diagram to show the configuration of the main part of a noise generator 1 in one embodiment incorporating the invention.

FIG. 1 is a block diagram to show the circuit configuration of a noise generator 1 in the embodiment. In the figure, the noise generator 1 comprises noise sources A 2 and B 3, amplifiers A 4 and B 5, filters A 6 and B 7, a quadrature modulator 8, and a local signal source 9. The noise source A 2, the amplifier A 4, and the filter A 6 generate an I signal for quadrature modulation and the noise source B 3, the amplifier B 5, and the filter B 7 generate a Q signal for quadrature modulation.

The noise sources A 2 and B 3 (corresponding to first and second noise sources as in aspects 1 and 5) are each made of a Zener diode circuit or the like. When the Zener diode circuit is operated at Zener voltage or less, a noise signal at a predetermined level (for example, about several millivolts) containing a random frequency component generated from the Zener diode circuit is output to the corresponding amplifier A 4, B 5.

A capacitor of a predetermined capacitance (not shown) functioning as a high-pass filter is connected in series to an output stage of the amplifier A 4 (corresponding to a first amplification circuit as in aspects 1 and 3) connected to an input stage of the filter A 6 and an amplification factor of the amplifier A 4 is set in accordance with a gain control signal input from an external control circuit (not shown). The amplifier A 4 amplifies the noise signal input from the noise source A 2 at the setup amplification factor and cuts a DC component superposed at the amplifying time (low-frequency component) by C coupling of the capacitor connected to the output stage, then outputs the noise signal to the filter A 6.

A capacitor of a predetermined capacitance (not shown) functioning as a high-pass filter is connected in series to an output stage of the amplifier B 5 (corresponding to a second amplification circuit as in aspects 1 and 3) connected to an input stage of the filter B 7 and a fixed amplification factor of the amplifier B 5 is set. The amplifier B 5 amplifies the noise signal input from the noise source B 3 at the fixed amplification factor and cuts a DC component superposed at the amplifying time (low-frequency component) by C coupling of the capacitor connected to the output stage, then outputs the noise signal to the filter B 7.

The filter A 6 (corresponding to a first filter circuit as in aspects 1 and 4) is a low-pass filter for outputting the noise signal of a desired frequency band of the amplified noise signal input from the amplifier A 4 to the quadrature modulator 8 as an I signal.

The filter B 7 (corresponding to a second filter circuit as in aspects 1 and 4) is a low-pass filter for outputting the noise signal of a desired frequency band of the amplified noise signal input from the amplifier B 5 to the quadrature modulator 8 as a Q signal.

The quadrature modulator 8 (corresponding to a modulation circuit as in aspect 1 and a quadrature modulation circuit as in aspect 2) multiplies the I signal input from the filter A 6 and the Q signal input from the filter B 7 by quadrature components based on angular frequency ω of a local signal input from the local signal source 9 and modulates, then outputs a noise signal corresponding to "antinoise environmental test" of CDMA.

That is, the quadrature modulator 8 multiplies the I signal input from the filter A 6 by (cos ωt) and the Q signal input from the filter B 7 by (sin ωt) with the angular frequency of the local signal source 9 as ω and performs an operation on the multiplication result values according to the following expression (1), then outputs the operation result as noise signal E after quadrature modulation:

$$E = I\cos \omega t - Q \sin \omega t \quad (1)$$

Expression (1) representing this quadrature modulation output E is deformed to the following expression (2):
[Expression 1]

$$E = \sqrt{I^2 + Q^2} \cdot \cos\left(\omega t + \tan^{-1}\left(\frac{I}{Q}\right)\right) \quad (2)$$

Figure 2A:
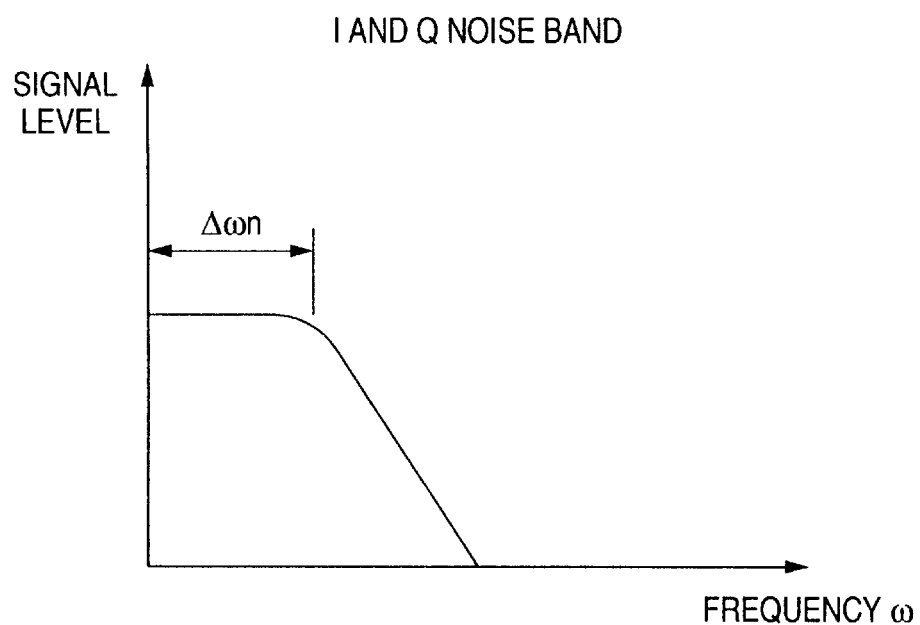
FIGS. 2A and 2B are drawings to show the frequency characteristics of specific I and Q signals input to a quadrature modulator 8 shown in FIG. 1.

If I and Q are independent random noise signals from the expression (2), the output signal E shows the following feature:

Now, letting the frequency band of the noise components contained in I and Q be Δωn as shown in FIG. 2A (Δωn can be determined by the filters A 6 and B 7), the crest value of the output signal E becomes random determined by the input levels of the I and Q signals and the output signal E can be assumed to be a noise signal with the angular frequency ω of the local signal supplied from the local signal source 9 as the center frequency.

Figure 2B:
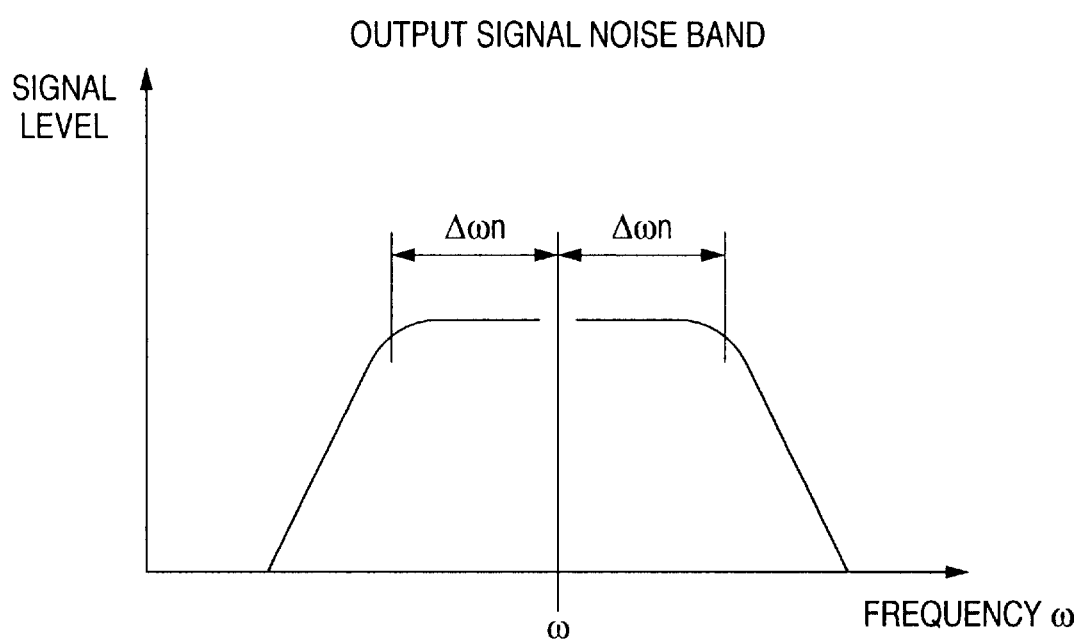

That is, the output signal E output from the quadrature modulator 8 has characteristics of having a frequency bandwidth of 2×Δωn and becoming symmetrical with respect to the center angular frequency ω as shown in FIG. 2B.

The phase component of the output signal E output from the quadrature modulator 8 is indicated by the arc tangent term of the expression (2) (tan⁻¹(Q/I)) and in the embedment, I and Q are independent random noise signals, thus their phase components also change at random. Therefore, if the I and Q signals are the same, the phase component becomes a fixed value.

Figure 3A:
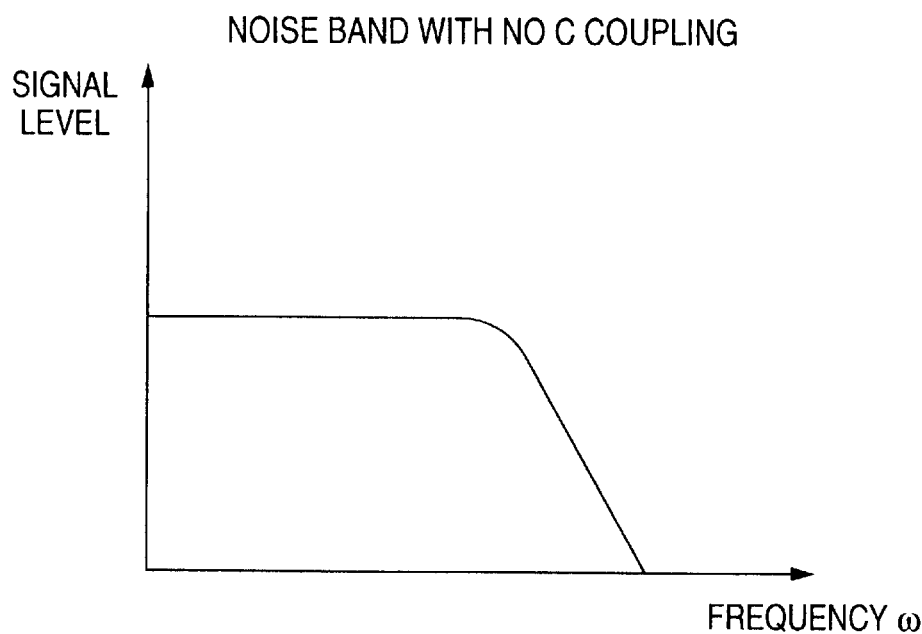
FIGS. 3A and 3B are drawings to show the frequency characteristics of amplified signal in amplifier A 4, B 5 in FIG. 1.
Figure 3B:
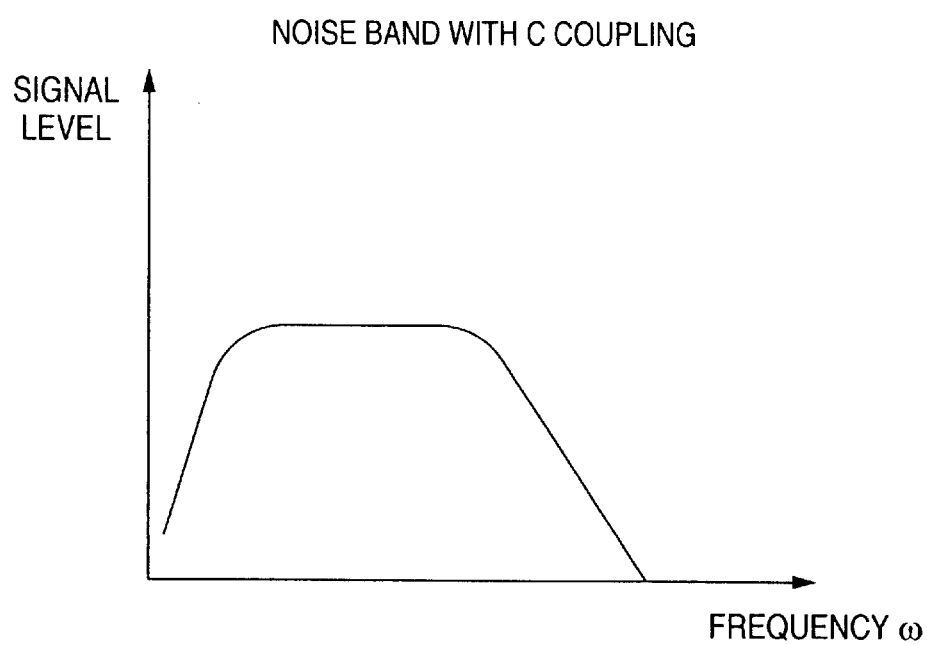

Before the noise signals output from the noise sources A 2 and B 3 undergo amplification and C coupling processing in the amplifiers A 4 and B 5, the DC component of the frequency band (low-frequency area) is flat as shown in FIG. 3A; however, after the noise signals undergo amplification and C coupling processing in the amplifiers A 4 and B 5, the level of the DC component (low-frequency area) lowers as shown in FIG. 3B.

Figure 4:
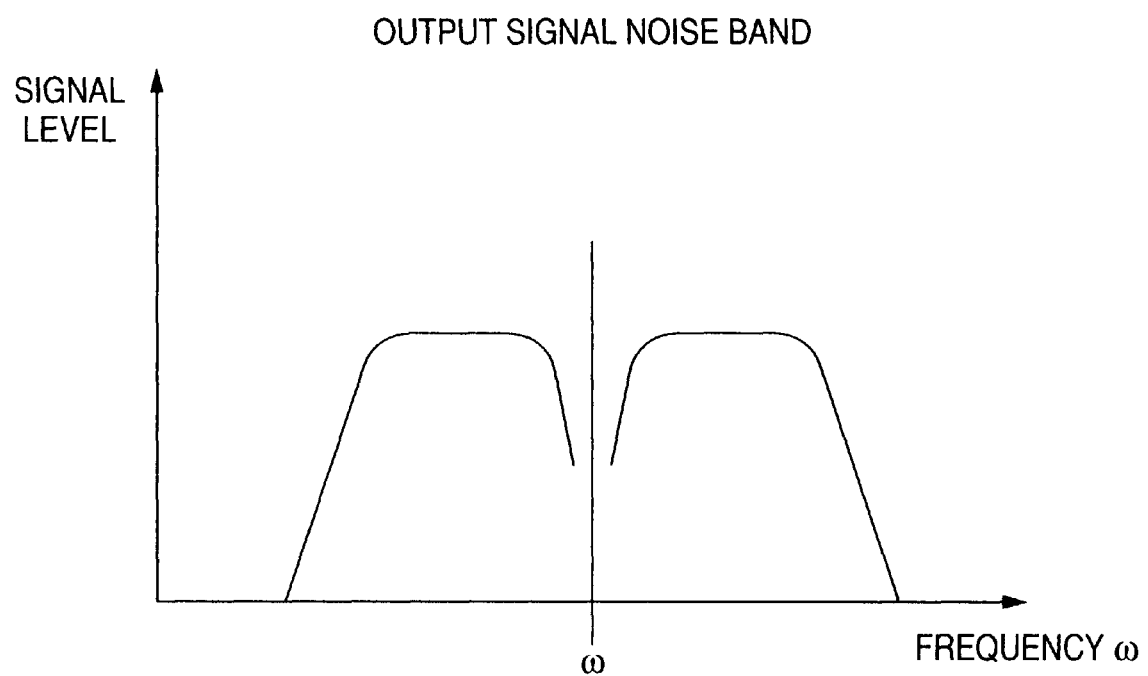
FIG. 4 is a drawing to show the noise band of an output signal resulting from quadrature-modulating the amplified signal in FIG. 3B.

Thus, the output signal E output from the quadrature modulator 8 is output in a state in which the noise signal levels in the proximity of the center angular frequency ω lower as shown in FIG. 4. Lowering of the noise signal levels in the proximity of the center angular frequency ω in the output signal E results in an undesired noise signal in the "antinoise environmental test" of CDMA because the signals to be measured concentrate in the proximity of the center angular frequency ω.

Then, with the noise generator 1 of the embodiment, the amplification factors in the amplifiers A 4 and B 5 are adjusted mutually, whereby the output level ratio of the noise signals output from the amplifiers A 4 and B 5 is made variable and the output levels of the noise signals are set out of balance, whereby from the relation of the arc tangent term of the expression (2) (tan⁻¹(Q/I)), the phase change amount can be made variable and an adjustment is made so that the noise signal levels in the proximity of the center angular frequency ω shown in FIG. 4 do not lower, then the frequency characteristic of the output signal E output from the quadrature modulator 8 can be set flat.

In FIG. 1, the local signal source 9 generates a local signal of the angular frequency ω (=800 MHz) required for quadrature modulation processing in the quadrature modulator 8 and supplies the local signal to the quadrature modulator B.

Next, the operation of the described noise generator 1 of the embodiment will be discussed with reference to FIG. 5.

Figure 5:
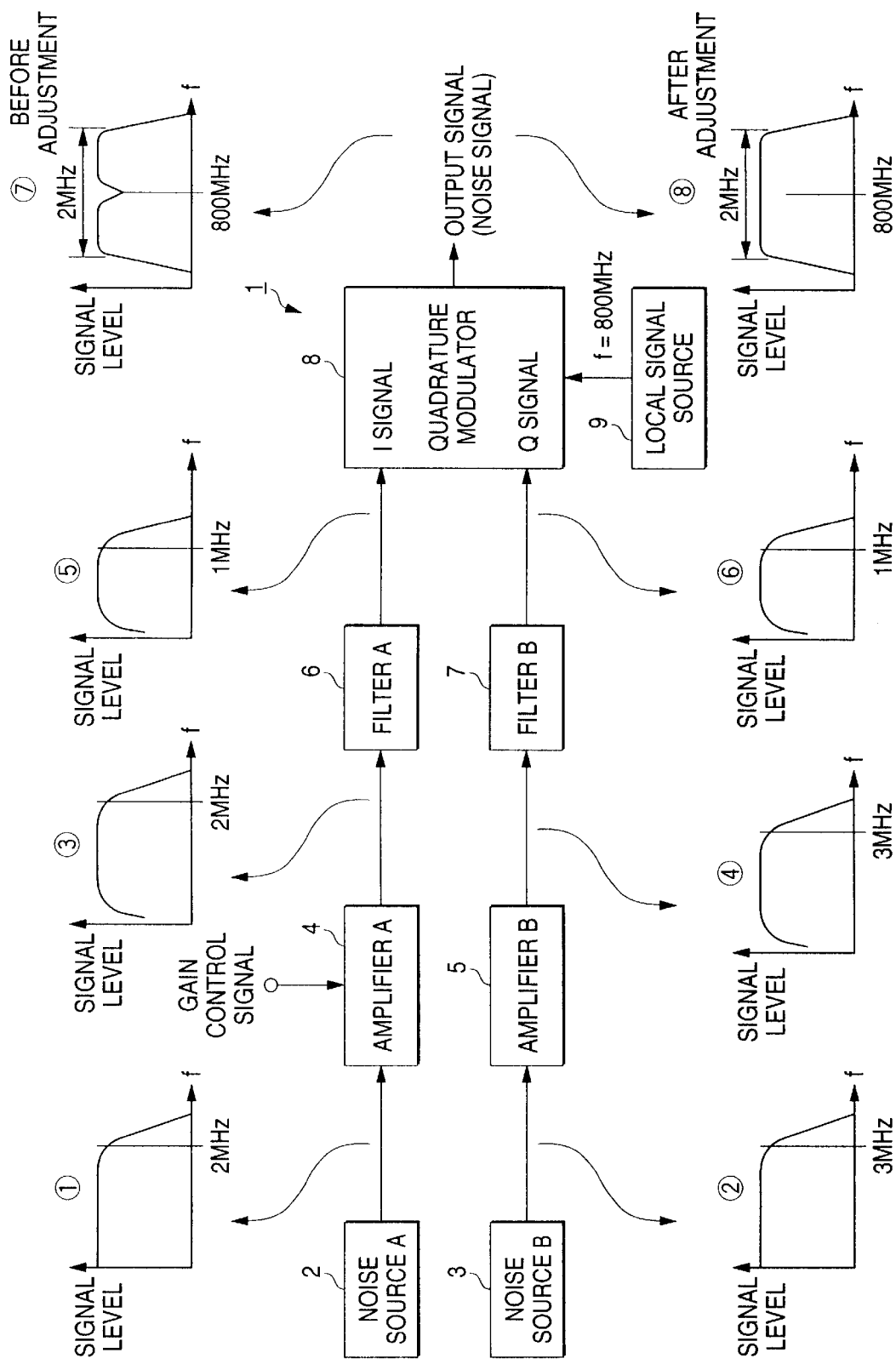
FIG. 5 is a drawing to describe the operation of circuit parts and the state of output signals of the circuit parts in the noise generator 1 in FIG. 1.

In FIG. 5, when the Zener diode circuits are operated at the Zener voltage or less, the noise sources A 2 and B 3 output noise signals having flat frequency bands up to 2 MHz, for example, as shown in ① and ② at predetermined levels (for example, about several millivolts) containing random frequency components generated from the Zener diode circuits to the amplifiers A 4 and B 5.

The amplifier A 4 amplifies the noise signal input from the noise source A 2 at the amplification factor set by the gain control signal input from the external control circuit and outputs to the filter A the amplified noise signal as shown in ③ in the figure with the DC component superposed at the amplifying time (low-frequency component) cut by C coupling processing of the capacitor functioning as a high-pass filter connected in series to the output stage of the amplifier A 4.

The amplifier B 5 amplifies the noise signal input from the noise source B 3 at the fixed amplification factor and outputs to the filter B 7 the noise signal having lowered DC component level as a result of amplification and C coupling processing as shown in ④ in the figure with the DC component superposed at the amplifying time (low-frequency component) cut by C coupling processing of the capacitor functioning as a high-pass filter connected in series to the output stage of the amplifier B 5.

The filter A 6 outputs the noise signal of a desired frequency band of the amplified noise signal input from the amplifier A 4 to the quadrature modulator 8 as the I signal having a frequency band of 1 MHz, for example, as shown in ⑤ in the figure.

The filter B 7 outputs the noise signal of a desired frequency band of the amplified noise signal input from the amplifier B 5 to the quadrature modulator 8 as the Q signal having a frequency band of 1 MHz, for example, as shown in ⑥ in the figure.

The quadrature modulator 8 multiples the I signal input from the filter A 6 and the Q signal input from the filter B 7 by quadrature components based on the angular frequency ω of the local signal input from the local signal source 9 based on the expression (1) and modulates, then outputs a noise signal being symmetrical with respect to the center angular frequency ω (=800 MHz) and having a frequency band width of 2 MHz as shown in ⑦ in the figure corresponding to the "antinoise environmental test" of CDMA.

The noise signal E shown in ⑦ indicates the state before execution of a level adjustment for compensating for the effect of cutting the DC component in the amplifier A 4 described above; the signal level in the proximity of the center angular frequency ω lowers.

Then, if a level adjustment for compensating for the effect of cutting the DC component is made in the amplifier A 4, a noise signal E being symmetrical with respect to the center angular frequency ω (=800 MHz) and having a frequency bandwidth of 2 MHz and a flat noise signal level as shown in ⑧ in the figure can be output.

Thus, to generate the noise signal corresponding to the "antinoise environmental test" of CDMA, the noise generator 1 in the embodiment comprises the noise source A 2, the amplifier A 4, and the filter A 6 for generating the I signal for quadrature modulation and the noise source B 3, the amplifier B 5, and the filter B 7 for generating the Q signal for quadrature modulation and performs quadrature modulation for the I and Q signals generated by the circuits by the quadrature modulator 8 in accordance with the local signal supplied from the local signal source 9, then outputs the noise signal.

Flattening the noise signal level in the proximity of the center angular frequency ω and the phase component of the noise signal output from the quadrature modulator 8 can be easily adjusted by varying setting of the amplification factors of the amplifiers A 4 and B 5.

Therefore, the configuration of the noise generator 1 in the embodiment for generating the noise signal corresponding to the "antinoise environmental test" of CDMA can be provided only by hardware, eliminating the need for software such as a program for controlling A/D conversion processing as in the related art. Consequently, the configuration of the noise generator 1 can be simplified and costs can be reduced.

In the embodiment, the noise sources A 2 and B 3 are made of Zener diode circuits and the filters A 6 and B 7 are made of low-pass filters, so that the costs of the noise generator 1 can be decreased. If setting of pass band characteristics of the filters A 6 and B 7 is made variable, the frequency band of the output noise signal can be easily made variable.

For the noise band of the noise signal output from the quadrature modulator 8, if the filters A 6 and B 7 are made of low-pass filters, the frequency bands of the output signals from the filters A 6 and B 7 are equivalent to those with a radio frequency band limited through a band-pass filter and thus the filter configuration in the radio frequency band becomes unnecessary and a steep band limitation can also be made easily.

According to the noise generator of the invention as in aspect 1, the noise generator can be constructed of only hardware and the costs of the noise generator can be decreased.

According to the noise generator of the invention as in aspect 2, a noise generator for generating a wide-band noise signal on a desired frequency band determined by the frequency of the local signal and the configuration of the first and second filter circuits can be constructed easily; for example, a noise generator for generating a noise signal that can be used with the "antinoise environmental test" of CMDA can be provided.

According to the noise generator of the invention as in aspect 3, amplification factor setting of both or either of the first and second amplification circuits can be made variable, thus a capacitor for cutting a DC component of the amplified noise signal is connected to the output stage in series, whereby flattening the noise signal level in the proximity of the center angular frequency ω and the phase component for the frequency characteristic in the proximity of the center angular frequency of the noise signal output from the quadrature modulation circuit can be easily adjusted by varying setting of the amplification factor of the first or second amplifier.

According to the noise generator of the invention as in aspect 4, a noise signal of a desired frequency band can be extracted easily.

According to the noise generator of the invention as in aspect 5, the costs of the noise generator can be decreased.

What is claimed is:

1. A noise generator comprising:

a first noise source for generating a predetermined noise signal;

a second noise source for generating a predetermined noise signal;

a first amplification circuit for amplifying the noise signal generated from said first noise source at a predetermined amplification factor;

a second amplification circuit for amplifying the noise signal generated from said second noise source at a predetermined amplification factor;

a first filter circuit for extracting a first noise signal contained in a predetermined frequency band from the noise signal amplified by said first amplification circuit;

a second filter circuit for extracting a second noise signal contained in a predetermined frequency band from the noise signal amplified by said second amplification circuit; and a modulation circuit for modulating the first noise signal extracted through said first filter circuit and the second noise signal extracted through said second filter circuit and outputting a noise signal of a desired frequency band.

2. The noise generator as claimed in claim 1, wherein said modulation circuit is a quadrature modulation circuit for quadrature-modulating the first and second noise signals based on a local signal of a desired angular frequency supplied from an external local signal source and outputting a noise signal of a desired frequency band.

3. The noise generator as claimed in claim 1, wherein amplification factor setting of both or either of said first and second amplification circuits being capable to be variable, and a capacitor for cutting a DC component of the amplified noise signal is connected to an output stage in series.

4. The noise generator as claimed in claim 1, wherein said first and second filter circuits comprises a low-pass filter circuit.

5. The noise generator as claimed in claim 1, wherein said first and second noise sources comprise a Zener diode circuit.

6. The noise generator of claim 2 wherein the amplification factor settings of at least one of the first and second amplification circuits is variable, and wherein a capacitor for cutting a DC component of the amplified noise signal is connected to an output in series.

7. The noise generator of claim 2 wherein the first and second filter circuits include a low-pass filter circuit.

8. The noise generator of claim 2 wherein the first and second noise sources include a Zener diode circuit.

9. The noise generator of claim 2 wherein the amplification factor settings of at least one of the first and second amplification circuits is variable, a capacitor for cutting a DC component of the amplified noise signal is connected to an output in series, the first and second filter circuits include a low-pass filter circuit, and the first and second noise sources include a Zener diode circuit.

10. The noise generator as claimed in claim 1, wherein each of the first and second noise sources comprises a diode.

* * * * *